US006982664B1

(12) United States Patent
Nairn

(10) Patent No.: US 6,982,664 B1
(45) Date of Patent: Jan. 3, 2006

(54) TIMING ENHANCEMENT METHODS AND NETWORKS FOR TIME-INTERLEAVED ANALOG-TO-DIGITAL SYSTEMS

(75) Inventor: David G. Nairn, Greensboro, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 10/982,201

(22) Filed: Nov. 4, 2004

(51) Int. Cl.
*H03M 1/06* (2006.01)
(52) U.S. Cl. ...................................... 341/118; 341/155
(58) Field of Classification Search ................ 341/141, 341/155, 118, 120, 126, 139
See application file for complete search history.

(56) References Cited

U.S. PATENT DOCUMENTS

| | | | | |
|---|---|---|---|---|
| 5,294,926 | A | * | 3/1994 | Corcoran ..................... 341/120 |
| 6,081,215 | A | * | 6/2000 | Kost et al. ................... 341/120 |
| 6,177,893 | B1 | | 1/2001 | Velazquez ................... 341/118 |
| 6,392,575 | B1 | | 5/2002 | Eklund ........................ 341/141 |
| 6,522,282 | B1 | * | 2/2003 | Elbornsson ................. 341/155 |
| 6,570,410 | B2 | | 5/2003 | Manganaro ................... 327/94 |

OTHER PUBLICATIONS

Looney, Mark, "Advanced Digital Post-Processing Techniques Enhance Performance in Time-Interleaved ADC Systems", Analog Dialogue 37-8, Aug. 2003, pp. 1-5.
Elbornsson, J., "Blind Estimation of Timing Errors in Interleaved AD Converters", Dept. of Electrical Engineering, Linkopings Universitet, Linkoping, Sweden, May 2001, 4 pages.

Sin, Sai-Weng, et al., "Timing-Mismatch Analysis in High-Speed Analog Front-End with Nonuniformly Holding Output", Faculty of Science and Technology, University of Macau, Macau, China, May 2003, 4 pages.
Jeng, Y-C, et al., "Sinewave Parameter Estimation Algorithm with Application to Waveform Digitizer Effective Bits Measurement", *IEEE Trans. Instrumentation and Measurement*, vol. 37, No. 4, Dec. 1988, pp. 529-532.
Jeng, Y-C, et al., "Digital Spectra of Nonuniformly Sampled Signals: A Robust Sampling—Using Interleaving", *IEEE Trans. Instrumentation and Measurement*, vol. 39, No. 1, Feb. 1990, pp. 71-75.
Hummels, D.M., "Distortion Compensation for Time-Interleaved Analog-to-Digital Converters", *IEEE Inst. and Measurement Tech Conf.*, Jun. 1996. pp. 728-731.
Jin, Huawen, "A Digital-Background Calibration Technique for Minimizing Timing-Error Effects in Time-Interleaved ADC's," *IEEE Transactions on Circuits and Systems-II: Analog and Digital Signal Processing*, vol. 47, No. 7, Jul. 2000. pp. 603-614.

* cited by examiner

*Primary Examiner*—Brian Young
(74) *Attorney, Agent, or Firm*—Koppel, Jacobs, Patrick & Heybl

(57) ABSTRACT

Timing enhancements of embodiments of the invention are realized in time-interleaved converter systems with minimal network additions that facilitate the insertion of a timing signal into the system's input analog signal. The timing signal travels with the input analog signal so that it continues to accurately define predetermined sample times in the analog signal even as they travel over different path lengths to individual converters. Each converter has a feedback path which adjusts the timing of that converter's samples with a correction signal whose value is determined by contributions of first and second different amplitudes of the timing signal to that converter's output signals.

26 Claims, 4 Drawing Sheets

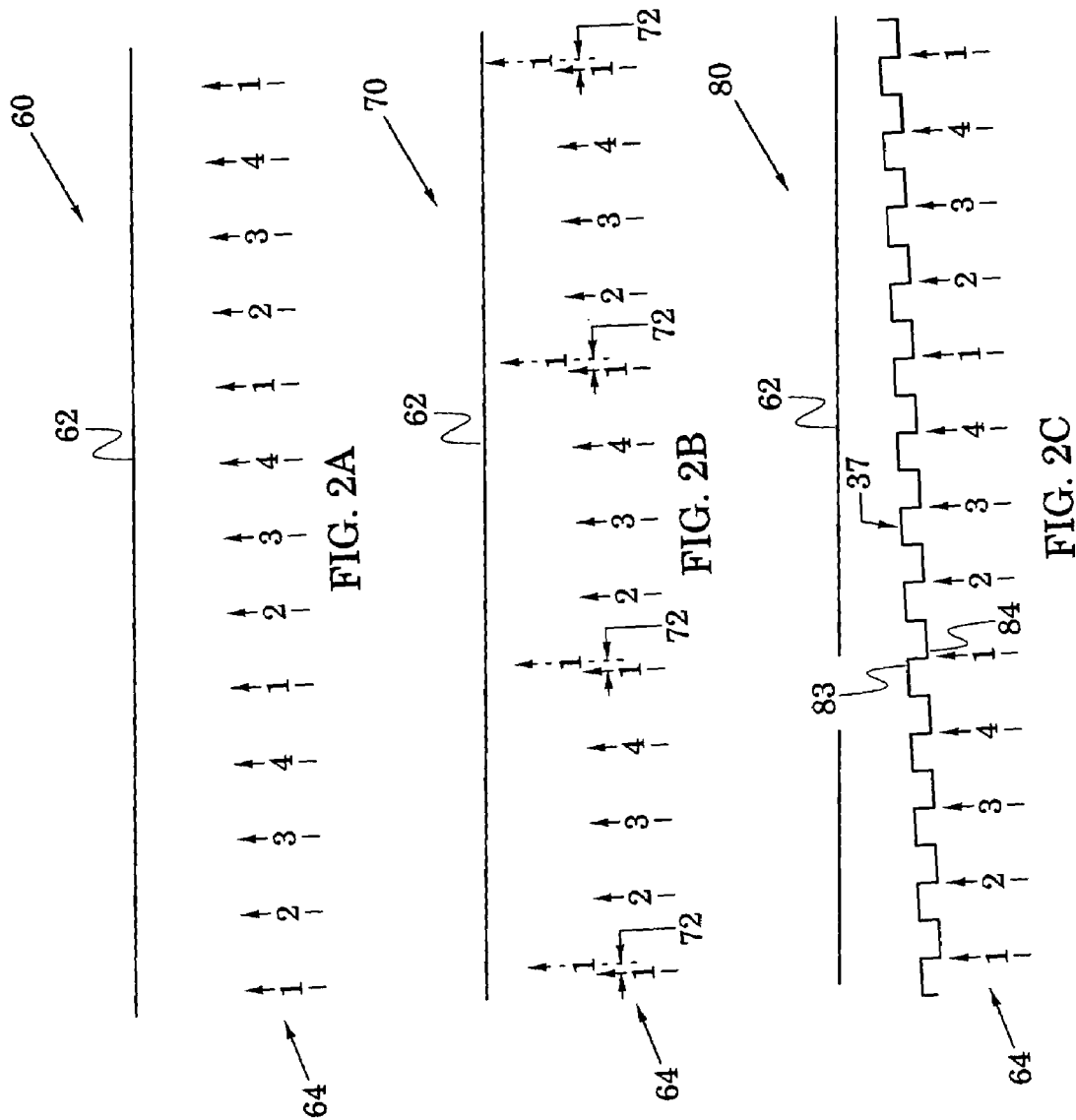

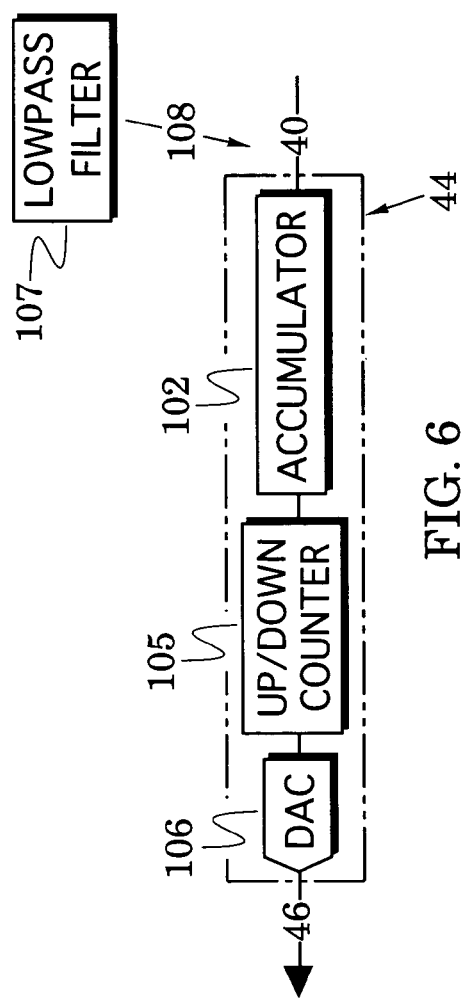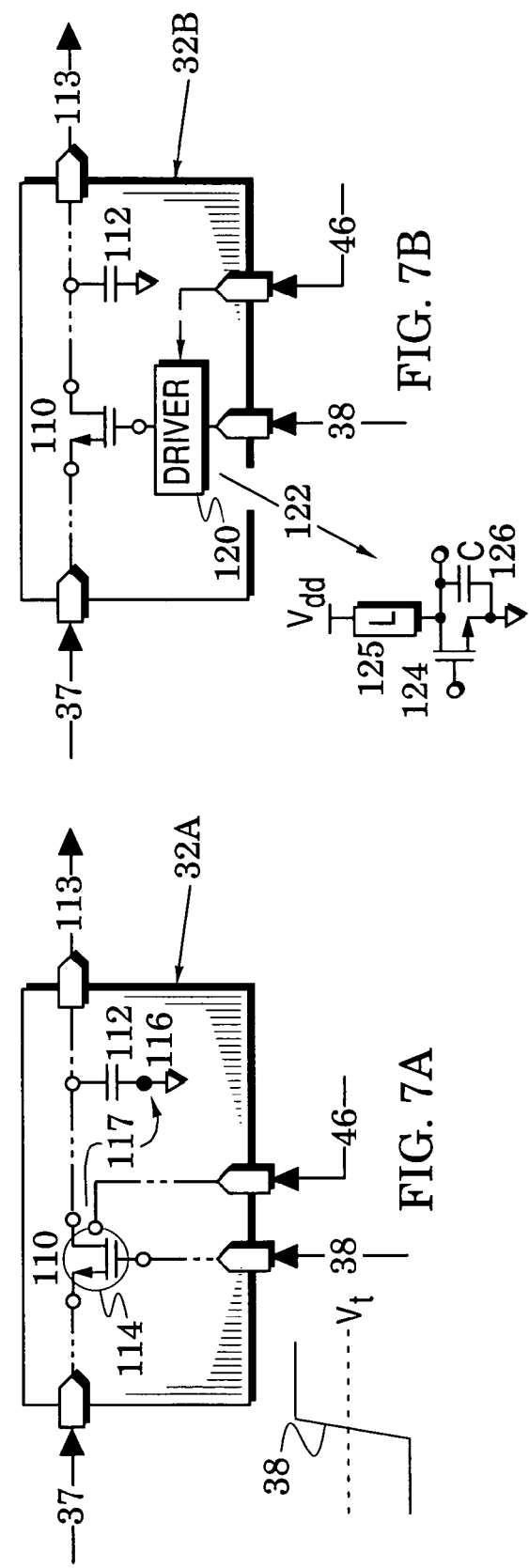
FIG. 6
FIG. 7B
FIG. 7A

TIMING ENHANCEMENT METHODS AND NETWORKS FOR TIME-INTERLEAVED ANALOG-TO-DIGITAL SYSTEMS

BACKGROUND OF THE INVENTION

1. Field of the Invention

The present invention relates generally to time-interleaved converter systems.

2. Description of the Related Art

Time-interleaving a set of analog-to-digital converters is a technique that achieves sample rates for a converter system greater than can be realized by any one of the individual converters. If converters can sample and convert signals at a converter rate $R_C$, for example, then N converters can be time-interleaved to realize a system rate $R_S = NR_C$.

Unfortunately, time-interleaved systems are sensitive to sample timing errors which may introduce significant spurious signals in their output digital signals. Efforts to reduce these timing errors have included the introduction of special calibration routines. These routines have typically required that the system operation be periodically suspended (to permit calibration) or required limitations in the characteristics of the analog input signals.

BRIEF SUMMARY OF THE INVENTION

The present invention is directed to timing enhancement for time-interleaved analog-to-digital systems. The novel features of the invention are set forth with particularity in the appended claims. The invention will be best understood from the following description when read in conjunction with the accompanying drawings.

BRIEF DESCRIPTION OF THE DRAWINGS

FIGS. 2A–2C are diagrams that indicate sample times and a corresponding timing signal in the system of FIG. 1;

FIG. 6 is a detailed embodiment of the correction feedback path of FIG. 5; and

FIGS. 7A and 7B illustrate sampler embodiments for the system of FIG. 1.

DETAILED DESCRIPTION OF THE INVENTION

Methods and network embodiments are described below which significantly enhance timing in time-interleaved converter systems. The embodiments are realized with relatively minor system additions that facilitate the insertion of a timing signal into the system's input analog signal. Because the timing signal travels with the input analog signal, it continues to accurately define the predetermined sample times in the analog signal even as they travel over different path lengths to individual converters.

Figure 1:
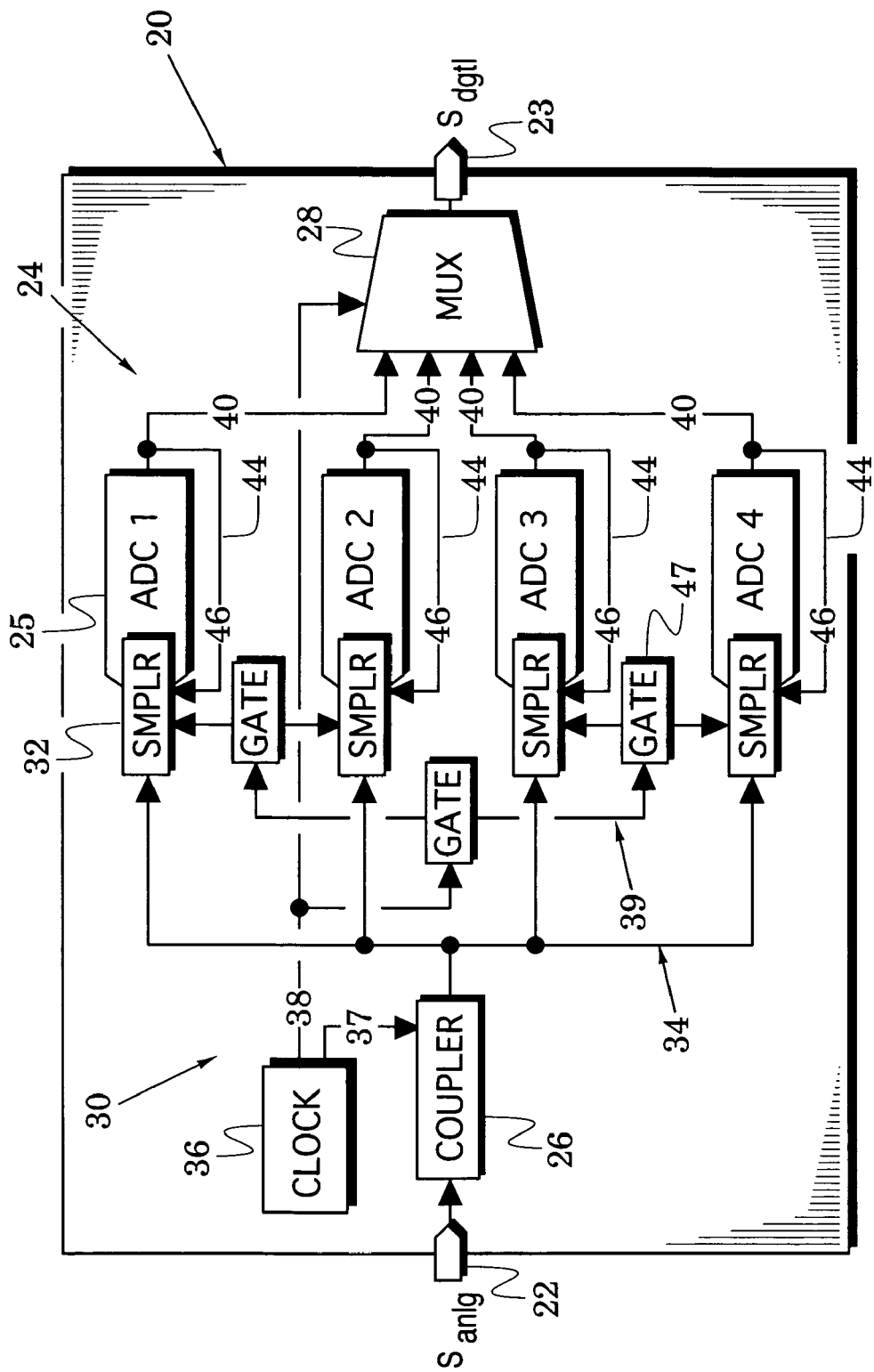
FIG. 1 is a block diagram of a time-interleaved converter system embodiment of the present invention.

In particular, FIG. 1 illustrates a time-interleaved system 20 that converts an analog input signal $S_{anlg}$ at a system input port 22 to a corresponding digital output signal $S_{dgtl}$ at a system output port 23. The system includes a set 24 of analog-to-digital converters (ADCs) 25, an input coupler 26, an output multiplexer (MUX) 28, and a clock network 30. Each of the converters 25 has an input sampler 32 which is coupled through a signal distribution path 34 to the input coupler 26. For illustrative purposes, the set 24 of FIG. 1 is shown to have four converters 25 (which are, accordingly, labeled ADC 1 through ADC 4).

The clock network 30 has a clock generator 36 which generates a timing signal 37 and a clock signal 38. The timing signal 37 is provided to the input coupler 26 which inserts it into the input signal $S_{anlg}$. The clock network 30 includes a clock distribution path 39 and the clock signal is carried through the path 39 to the sampler 32 of each of the converters 25. The path 39 also carries the clock signal 38 to the multiplexer 28 which, in response, selectively couples each converter's output signal 40 to the ouput port 23. Each of the converters 25 has a correction feedback path 44 which inserts a correction signal 46 into the sampler 32 of that converter.

In operation of the system 20, the clock 36 inserts the timing signal 37 into the input signal via the input coupler 26 and the input signal and the inserted timing signal are carried to the samplers 32 over the signal distribution path 34. The clock signal 38 is carried over the clock distribution path 39 (which may, for example, comprise a system of digital gates 47) to the samplers 32. The clock signal generally defines pulses at a system rate wherein these pulses represent time-interleaved phases that are each directed to a sampler 32 of a respective ADC 25. Because the exemplary system 24 of FIG. 1 has four ADCs 25, each ADC's sampler would receive a respective one of four clock phases wherein each phase consists of every fourth one of the clock pulses.

In response to its respective clock phase, each sampler 32 provides samples of the combined input signal and timing signal to its respective ADC which generates, at some later time, a corresponding digital signal 40 that is coupled to the multiplexer 28. The clock signal (or a version of it) commands the multiplexer to interleavably direct the digital signals from all of the ADCs 25 to the output port 23 where they form the digital output signal $S_{dgtl}$.

The time-interleaved system 20 can process samples of the input signal at a system rate $R_S$ while each converter 25 (and its sampler 32) process respective input signals at a converter rate $R_C = R_S/N$ wherein N is the number of converters (N=4 in FIG. 1). Accordingly, the system can process signals at rates that the converters cannot realize on their own. Ideally, each converter 25 processes respective signal samples that have been obtained from the analog input signal $S_{anlg}$ at predetermined sample times (that correspond to that converter's respective clock phase).

However, the timing signal 37 and the clock signal 38 have to be carried to each converter 25 over the distribution paths 34 and 39. If the time delays through the clock distribution paths are not equal, the analog input signal will not be sampled at the predetermined sample times. Similarly, if the time delays through the signal distribution paths are not equal, the analog input signal will not be sampled at the predetermined sample times. In practice, it is extremely difficult to insure that the delay times through the distribution paths are all equal.

However, the input signal 37 and the clock signal 38 have to be carried to each converter 25 over the distribution paths 34 and 39. If the time delays through the clock distribution paths are not equal, the analog input signal will not be sampled at the predetermined sample times. Similarly, if the time delays through the signal distribution paths are not equal, the analog input signal will not be sampled at the predetermined sample times. In practice, it is extremely difficult to insure that the delay times through the distribution paths are all equal.

An exemplary analog input signal $S_{anlg}$ is shown in the timing diagram 60 of FIG. 2A to be a slowly decreasing analog signal 62. A series of arrows indicate the predetermined sample times 64 where it is desired that samples of the analog signal 62 are obtained. FIG. 2B shows a timing diagram 70 which is similar to the graph 60 of FIG. 2A with like elements indicated by like reference numbers. In the diagram 70, it is assumed there is a path difference in the clock distribution paths (38 in FIG. 1) sufficient to cause samples in ADC 1 of FIG. 1 to be taken at a time indicated by broken arrows that are displaced from the predetermined sample times 64 for ADC 1 by a timing error 72. Obviously, the timing error 72 will introduce errors into the digital output signal $S_{dgtl}$ of FIG. 1.

FIG. 2C shows a timing diagram 70 which is similar to the graph 60 of FIG. 2A with like elements indicated by like reference numbers. A method embodiment of the invention provides a timing signal 37 that has first and second different amplitudes 83 and 84 at first and second different sides of the predetermined sample times 64. The timing signal 37 is inserted into the analog input signal 62 with the coupler 26 of FIG. 1.

Accordingly, the first and second different amplitudes define the predetermined sample times and, because the timing signal is part of the input signal, this timing information is carried with the input signal to each ADC 25 (and its respective sampler 32). Although the arrival time of the input signal at each sampler 32 may be altered by path differences in the signal distribution paths 34, the inserted timing signal continues to accurately define the predetermined sample times in the analog signal.

Figure 3:
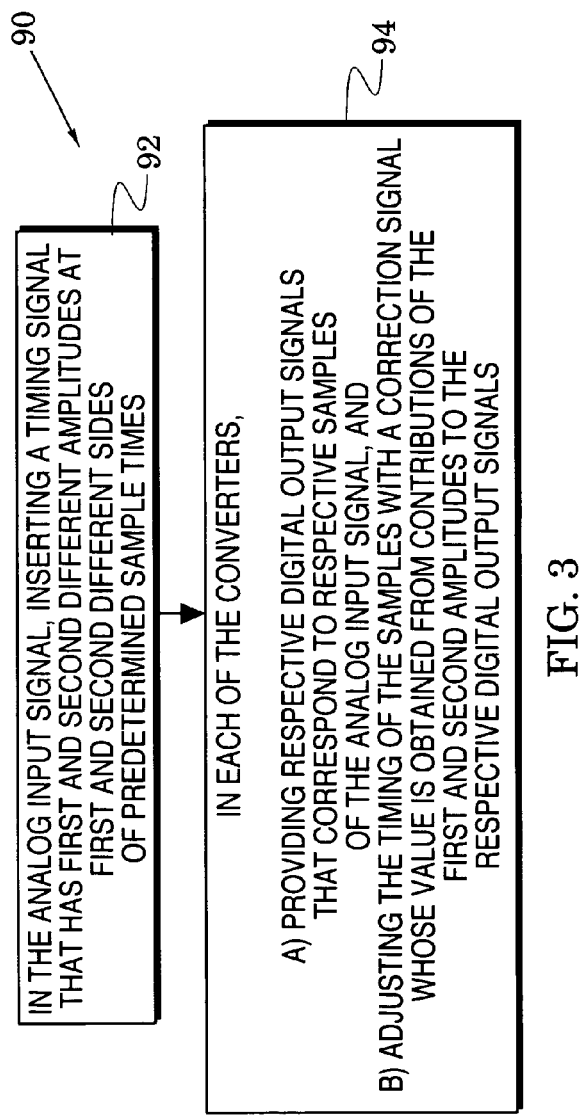
FIG. 3 is a flow chart that recites process embodiments in the system of FIG. 1.

This process embodiment is shown as process 92 in the flow chart 90 of FIG. 3. Process 94 of FIG. 3 is carried out at each of the ADCs 25 of FIG. 1. First, respective samples of the analog input signal are converted to respective digital output signals (40 in FIG. 1). These samples are taken by the ADC's input sampler 25. As further recited in process 94 of FIG. 3, the timing of the samples is adjusted with a correction signal whose value corresponds to contributions of the first and second amplitudes to the respective digital output signals. This process is carried out by the correction feedback path 44 of FIG. 1 which inserts a correction signal 46 into the sampler 32 of the respective converter 25.

The first amplitude 83 of FIG. 2C will contribute one signal polarity if the sampler 32 of an ADC takes its samples earlier than the predetermined sample times and the different second amplitude 84 will contribute a different signal polarity if the sampler takes its samples later than the predetermined sample times. A correction signal 46 is thus inserted into the digital output signal and the value of this correction signal (e.g., its sign and/or amplitude) indicates the time relationship between the samples and the predetermined sample times.

That is, the correction signal indicates whether the samples are taken late or early and may also indicate the magnitude of the timing error. The timing-error information of the correction signal 46 is thus suited for use as a feedback signal in the sampler 32 to correct the timing of the samples so that they better correspond to the predetermined sample times of the timing signal 37 of FIG. 2C.

Figure 4:
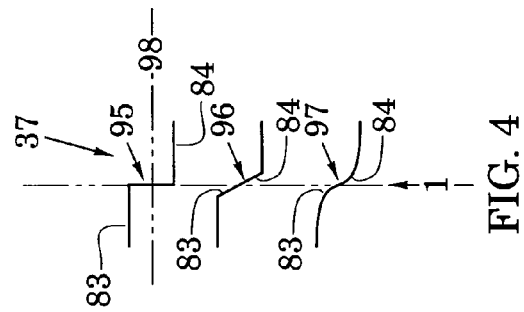
FIG. 4 is a diagram of timing signal embodiments for the system of FIG. 1.

FIG. 4 shows that the timing signal (37 in FIG. 1) can be configured with a waveform that defines substantially vertical edges 95 between the first and second amplitudes 83 and 84. The edge 95 is positioned at a predetermined sampling time (indicated by a phase 1 arrow) and the first and second amplitudes may be equally spaced from a mid-level amplitude 98 (e.g., ground). Alternatively, the timing signal can be configured with a waveform that defines a sloped edge which is a linear edge 96 or an arcuate edge 97.

In addition, FIG. 4 indicates that the first and second amplitudes 83 and 84 can be any different amplitudes that are on respective sides of the predetermined sampling time. These signal amplitudes will contribute to the value of the correction signal (46 in FIG. 1) which can then be used to adjust the sample timing. Although FIGS. 2C and 4 show the vertical edges 95 to be falling edges, rising edges can be used in other converter embodiments.

Figure 5:
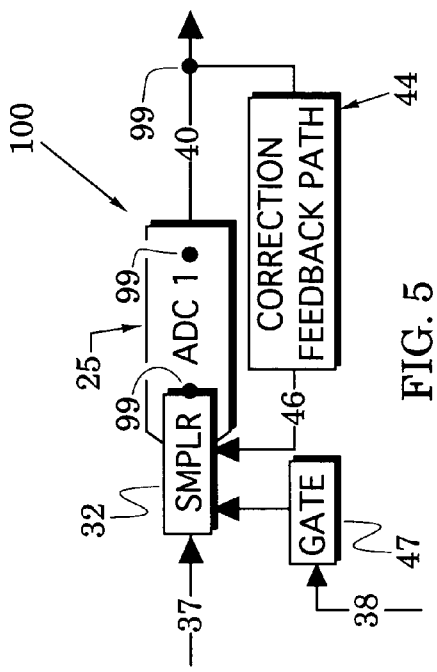
FIG. 5 is a diagram of a correction feedback path embodiment for the system of FIG. 1.

The first ADC 1 is shown again in the diagram 100 of FIG. 5 which more explicitly shows the correction feedback path 44 that generates the correction signal 46 from the output digital signal 40. The path provides the correction signal to the sampler 32 for timing adjustment. FIG. 6 illustrates an embodiment of the correction feedback path 44 that includes an accumulator coupled to an up/down converter 104.

In operation, the accumulator 102 and counter 104 act as an integrator of the digital signal 40 from the ADC 25. Over a selected accumulate time period, successive digital signals are added to the accumulator's register. At the end of the accumulate period, the counter counts in one direction if the accumulator's output is positive and in a different direction if it is negative. The counter's output is thus an indication of the digital output of the ADC 25 over a selected integration time. In another integrator embodiment, the counter and accumulator positions can be exchanged). A digital lowpass filter 107 can be inserted ahead of the accumulator (as indicated by insertion arrow 108) to extend the range of the accumulator and to selectively shape the integration bandwidth.

In one embodiment, therefore, the correction feedback path 44 is a feedback integrator formed with at least one of various digital integrators (e.g., accumulators, counters, and filters). Although the digital correction signal generated by the feedback integrator may be used in many converter embodiments, there are other embodiments which may find an analog correction signal useful. Accordingly, FIG. 6 shows that a digital-to-analog converter (DAC) 106 may be inserted so that the correction signal 46 is an analog signal. In this embodiment, the up/down counter 105 effectively scales the output of the accumulator and/or filter to better match the input range of the DAC.

Although the feedback path 44 has been described above to have an origin 99 at the output of the ADC 25, it may have other origins in other converter embodiments. The ADC, for example, may be a multistage converter and the origin 99 may be located at some stage point within the ADC as shown in FIG. 5. As also shown, the origin 99 may be at the output of the sampler 32. In this latter embodiment, the correction feedback path may be formed by an analog integrator. For example, the integrator may be an analog lowpass filter such as a continuous-time filter (e.g., an active RC filter or an active Gm-C filter) or a discrete-time filter (e.g., a switched-capacitor filter).

The correction signal may be used in various embodiments to adjust the timing of the samples of the analog input signal. FIG. 7A, for example, illustrates an embodiment 32A of the samplers 32 of FIG. 1. In the sampler 32A, a metal-oxide-semiconductor (MOS) transistor 110 is coupled as a switch that can be momentarily turned on to pass a sample of the timing signal 37 (and the analog input signal from port 22 of FIG. 1) for storage in a capacitor 112.

In absence of the clock signal, the transistor is turned off and the sample charge in the capacitor 112 is transferred out of the sampler as a sample signal 113 (various transfer circuitry can be used) which is then converted by the remainder of the ADC (25 in FIG. 5). The capacitor is then ready to receive a subsequent sample (other sampler structures may first remove the existing sample from the capacitor).

Various other sampler embodiments may be used. In different embodiments, for example, the switch transistor 110 may be positioned on the downstream side 116 of the capacitor as indicated by the position arrow 117, the transistor 110 may be accompanied by another switch transistor that is positioned on the downstream side 116, and the sample signal 113 may be taken from the downstream side 116 of the capacitor 112. Therefore, the following discussion applies to sampling switch transistors in general.

The switch transistor 112 is fabricated to lie in a semiconductor well 114 and is momentarily switched on by applying the clock signal 38 to its gate. As shown in FIG. 7A, the transistor 110 switches when the clock signal 38 exceeds the transistor's threshold voltage $V_t$ and the threshold voltage can be varied by varying the potential of the transistor well 114. Because the clock signal can be configured to have a sloping edge, the transistor's switching time is now a function of the correction signal 46. The correction signal thus adjusts the timing of the samples taken by the sampler 32A and the feedback path (46 in FIG. 5) will adjust this timing to reduce differences between the timing of the samples and the predetermined sample times that are defined by the timing signal (37 in FIG. 2C).

FIG. 7B illustrates another embodiment 32B of the samplers 32 of FIG. 1. The sampler 32B includes the pass transistor 110 and capacitor 112 of FIG. 32A and adds a clock driver 120 that passes the clock signal 38 to the gate of the pass transistor. As indicated by an example arrow 122, the clock signal generally passes through at least one driver transistor 124 which has a control terminal (e.g., a gate) responsive to the clock signal 38 and a current terminal (e.g., a drain) that is coupled to a supply voltage (e.g., Vdd) through a load (L) 125 (e.g., a resistor or an active load). A capacitance (C) 126 may also be coupled to the current terminal.

Because the response time of the driver 120 is a function of a) impedance of the load L, b) the capacitance C, c) the supply voltage, and the driver's threshold voltage $V_t$, the response of the driver can be altered by changing any of these driver parameters with the correction signal 46. In at least one embodiment of the time-interleaved system 20 of FIG. 1, it is anticipated that a timing adjustment range on the order of 10 picoseconds will be sufficient to correct the converter sampling errors. Because the transition time in an exemplary MOS fabrication process is on the order of 50 picoseconds, the required correction of sampling errors can be realized as shown in FIG. 7A in which the response time of the pass transistor 110 is altered or as shown in FIG. 7B in which the transition time of the driver 120 is altered.

Some analog input signals to the system embodiments of the invention may include a DC component if considered over a short time interval. Because this DC component may mask or degrade the contribution of the timing signal to the digital output signals, its effect must be addressed and removed or reduced. In one method embodiment, this may be accomplished by increasing the integration time of the feedback path integrator (e.g., by narrowing the pass band of the lowpass filter 107 of FIG. 6).

Other analog input signals to the system embodiments of the invention may include a constant DC component which would mask or degrade the contribution of the timing signal to the digital output signals. This component may be shifted to a predetermined frequency by chopping the input analog signal. This shift removes any degradation of the timing signal. It may be desirable to conduct the chopping at a random rate to avoid introduction of output spurious signals.

The timing signal may also be degraded by the presence of unusually large offset errors in the system converters. Offsets of interleaved systems are, however, generally calibrated to be less than ¼ of the level of the least significant bit. Accordingly, the level of the timing signal can be set below the least significant bit level and its contribution to the output digital signals will be minimal.

In some embodiments of the method and network embodiments of the invention, the waveform of the timing and clock signals may be substantially identical and, accordingly, the timing signal can easily be generated by a simple modification of the clock signal generator which is already part of the converter system.

In some uses of the method and network embodiments of the invention, the correcting action of the correction feedback path may impart discernible spurious signals into the system's output digital signal. These may be removed or reduced by running the feedback path only at selected times or by introducing hysteresis into the feedback path.

As previously stated, the timing enhancements of embodiments of the invention are realized with minimal network additions (e.g., the coupler 26 and the feedback path 46 of FIG. 1) that facilitate the insertion of a timing signal into the system's input analog signal. The timing signal travels with the input analog signal so that it continues to accurately define predetermined sample times in the analog signal even as they travel over different path lengths to individual converters. Each converter has a feedback path which adjusts the timing of that converter's samples with a correction signal whose value is determined by contributions of first and second amplitudes of the timing signal to that converter's output signals.

It is further noted that the method and network embodiments of the invention rely only on the amplitudes of the timing signal immediately prior and subsequent to the predetermined sample times and is thus substantially unaffected by the timing signal's waveform in other regions.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A method of correcting sampling errors in analog-to-digital converters of a time-interleaved system that converts an analog input signal to a corresponding digital output signal, comprising the steps of:
   in said analog input signal, inserting a timing signal that has first and second different signal amplitudes at first and second different sides of predetermined sample times; and
   with each of said converters:
   a) converting respective samples of said analog input signal to respective digital output signals; and
   b) adjusting the timing of said samples with a correction signal whose value is determined by contributions of said first and second amplitudes to said respective digital output signals;
wherein said inserting step includes the step of configuring said timing signal to have a waveform that defines a first amplitude level prior to said sample times and a different second amplitude level subsequent to said sample times.

2. The method of claim 1, wherein said inserting step includes the step of configuring said timing signal to have a waveform that defines substantially vertical edges at said sample times.

3. The method of claim 1, wherein said inserting step includes the step of configuring said timing signal to have a waveform that defines sloped edges at said sample times.

4. The method of claim 3, wherein said edges are linear edges.

5. The method of claim 3, wherein said edges are curved edges.

6. The method of claim 1, wherein said converting step includes the step of obtaining said samples with at least one sampling device that responds to a respective clock signal and said adjusting step includes the step of modifying the response of said sampling device to said clock signal.

7. The method of claim 6, wherein said sampling device is a transistor and said modifying step includes the step of altering a threshold voltage of said transistor.

8. The method of claim 1, wherein said converting step includes the step of obtaining said samples with at least one sampling device that responds to a respective clock signal and said adjusting step includes the step of modifying said clock signal with said correction signal.

9. The method of claim 8, wherein said modifying step includes the step of altering a waveform slope of said clock signal.

10. The method of claim 1, wherein said converting step includes the step of quantizing said analog input signal to a least significant bit in said digital output signal and said adjusting step includes the step of restricting the difference between said first and second amplitudes to less than said least significant bit.

11. A time-interleaved converter system that converts an analog input signal to a corresponding digital output signal, comprising:
a signal generator that inserts, into said analog input signal, a timing signal with first and second different signal amplitudes at first and second different sides of predetermined sample times;
analog-to-digital converters that each convert respective samples of said analog input signal to respective output signals;
associated with each of said converters,
  a) a sampler that provides said respective samples in response to a respective clock signal; and
  b) a feedback path that, in response to contributions of said first and second amplitudes to at least one of said samples and said respective output signals, provides a correction signal that adjusts the timing of said respective samples; and
a multiplexer that temporally interleaves said respective output signals to form said digital output signal.

12. The system of claim 11, wherein said signal generator also generates said respective clock signal.

13. The system of claim 11, wherein said signal generator provides said timing signal with a waveform that defines a first amplitude level prior to said sample times and a different second amplitude level subsequent to said sample times.

14. The system of claim 11, wherein said signal generator provides said timing signal with a waveform that defines substantially vertical edges at said sample times.

15. The system of claim 11, The system of claim 1, wherein said signal generator provides said timing signal with a waveform that defines sloped edges at said sample times.

16. The system of claim 15, wherein said edges are linear edges.

17. The system of claim 15, wherein said edges are curved edges.

18. The system of claim 11, wherein said feedback path includes an integrator that provides said correction signal in response to said respective output signals.

19. The system of claim 18, wherein said integrator is formed by at least one of an accumulator, an up/down counter and a digital filter.

20. The system of claim 18, further including a digital-to-analog converter that converts said correction signal to an analog correction signal.

21. The system of claim 11, wherein said sampler has at least one sampling device that passes said respective samples with a response time that corresponds to said correction signal.

22. The system of claim 21, wherein said sampling device is a transistor whose threshold voltage is altered by said correction signal.

23. The system of claim 11, further including a driver that couples said respective clock signal to said sampler with a response time determined by said correction signal.

24. A time-interleaved converter system that converts an analog input signal to a corresponding digital output signal, comprising:
a signal generator that inserts, into said analog input signal, a timing signal with first and second different signal amplitudes at first and second different sides of predetermined sample times;
analog-to-digital converters that each convert respective samples of said analog input signal to respective output signals;
a clock generator that provides time-interleaved clock signals to said converters;
associated with each of said converters,
  a) a sampler that provides said respective samples in response to a respective clock signal; and
  b) a feedback path integrator that, in response to contribution of said first and second amplitudes to at least one of said samples and said respective output signals, provides a correction signal that adjusts the timing of said respective samples; and
a multiplexer that temporally interleaves said respective output signals to form said digital output signal.

25. The system of claim 24, wherein said sampler is configured to pass said respective samples with a response time that corresponds to said correction signal.

26. The system of claim 24, further including a driver that couples said respective clock signal to said sampler with a response time determined by said correction signal.

* * * * *